US012653069B2

(12) United States Patent
Harris et al.

(10) Patent No.: US 12,653,069 B2
(45) Date of Patent: Jun. 9, 2026

(54) LED-BASED PHOTONIC COMMUNICATION AND PROCESSING UNIT

(71) Applicant: Lightmatter, Inc., Boston, MA (US)

(72) Inventors: Nicholas C. Harris, Boston, MA (US); Darius Bunandar, Boston, MA (US)

(73) Assignee: Lightmatter, Inc., Mountain View, CA (US)

( * ) Notice: Subject to any disclaimer, the term of this patent is extended or adjusted under 35 U.S.C. 154(b) by 601 days.

(21) Appl. No.: 18/140,360

(22) Filed: Apr. 27, 2023

(65) Prior Publication Data

US 2023/0352465 A1      Nov. 2, 2023

Related U.S. Application Data

(60) Provisional application No. 63/336,216, filed on Apr. 28, 2022.

(51) Int. Cl.
*H10W 90/00* (2026.01)
*G02B 6/42* (2006.01)
(Continued)

(52) U.S. Cl.
CPC .......... *H10W 90/00* (2026.01); *G02B 6/4274* (2013.01); *G06F 17/16* (2013.01); *H04B 10/50572* (2013.01)

(58) Field of Classification Search
CPC ... G02B 1/10; G02B 3/02; G02B 3/12; G02B 5/04; G02B 5/12; G02B 5/20; G02B 6/02;
(Continued)

(56) References Cited

U.S. PATENT DOCUMENTS

| 3,944,820 A | 3/1976 | Stotts |
| 4,566,077 A | 1/1986 | Schuocker et al. |
| | (Continued) | |

FOREIGN PATENT DOCUMENTS

| TW | 202005312 A | 1/2020 |
| TW | 202013265 A | 4/2020 |
| WO | WO 2017/210550 A1 | 12/2017 |

OTHER PUBLICATIONS

Nicholas C. Harris et al., "Accelerating artificial intelligence with silicon photonics," May 4, 2020, 2020 Optical Fiber Communications Conference and Exhibition (OFC), pp. 1-3.*

(Continued)

*Primary Examiner* — Omar S Ismail
(74) *Attorney, Agent, or Firm* — Wolf, Greenfield & Sacks, P.C.

(57) ABSTRACT

Photonic processors are described herein that are configured to perform matrix-matrix (e.g., matrix-vector) multiplication by directly encoding a first value in the output of the light source. Some embodiments relate to a photonic device configured to perform a mathematical operation, the photonic device comprising a modulatable light emitting diode (LED) and a modulatable detector. The modulatable LED being configured to emit light. The modulatable detector being optically coupled to an output of the modulatable LED. The photonic device further comprising, a controller being configured to encode a first value in the light emitted by the modulatable LED and to encode a second value in a characteristic of the modulatable detector; and a receiver configured to determine a result of the mathematical operation based on an electrical signal produced by the modulatable detector.

22 Claims, 10 Drawing Sheets

(51) Int. Cl.
*G06F 17/16* (2006.01)
*H04B 10/50* (2013.01)

(58) Field of Classification Search
CPC ... G02B 6/04; G02B 6/10; G02B 6/24; G02B 6/46; G02B 7/02; G02B 7/18; G02B 7/20; G02B 7/28; G02B 9/04; G02B 9/12; G02B 9/34; G02B 11/02; G02B 11/06; G02B 11/20; G02B 13/08; G02B 13/24; G02B 15/14; G02B 15/02; G02B 17/02; G02B 21/02; G02B 21/06; G02B 21/18; G02B 21/24; G02B 23/02; G02B 23/16; G02B 23/24; G02B 26/02; G02B 26/08; G02B 27/02; G02B 27/10; G02B 27/18; G02B 27/32; G02B 27/42; G02B 27/50; G02B 30/20; G02B 30/50; G02B 30/22; G02B 30/26; G02B 30/34
See application file for complete search history.

(56) References Cited

U.S. PATENT DOCUMENTS

| | | | |
|---|---|---|---|
| 5,321,639 A * | 6/1994 | Krishnamoorthy .. | G06N 3/0675 708/7 |
| 5,877,519 A | 3/1999 | Jewell | |
| 6,411,418 B1 * | 6/2002 | Deri | H04Q 11/0062 398/182 |
| 6,586,778 B2 | 7/2003 | Linthicum et al. | |
| 6,967,981 B2 | 11/2005 | Chua et al. | |
| 7,018,580 B2 | 3/2006 | Gorczyca et al. | |
| 7,042,020 B2 | 5/2006 | Negley | |
| 7,218,388 B1 | 5/2007 | Keeler et al. | |
| 7,813,401 B2 | 10/2010 | Scherer | |
| 8,027,587 B1 | 9/2011 | Watts | |
| 8,450,719 B2 | 5/2013 | Moon | |
| 8,526,771 B2 | 9/2013 | Meyer et al. | |
| 9,930,277 B2 * | 3/2018 | Cok | G09G 3/20 |
| 10,763,974 B2 | 9/2020 | Bunandar et al. | |
| 11,281,972 B2 | 3/2022 | Shen | |
| 11,507,818 B2 | 11/2022 | Hosseinzadeh et al. | |
| 2001/0041025 A1 | 11/2001 | Farahi | |
| 2002/0074528 A1 * | 6/2002 | O'Connor | G01V 8/12 250/559.4 |
| 2004/0119197 A1 | 6/2004 | Gorczyca et al. | |
| 2006/0093299 A1 * | 5/2006 | Ogawa | G02B 6/1225 385/39 |
| 2006/0274796 A1 | 12/2006 | Cheng et al. | |
| 2008/0080579 A1 | 4/2008 | Scherer | |
| 2009/0080898 A1 | 3/2009 | Anderson et al. | |
| 2010/0317420 A1 * | 12/2010 | Hoffberg | G06Q 30/0282 463/1 |
| 2011/0150390 A1 | 6/2011 | Meyer et al. | |
| 2012/0032969 A1 * | 2/2012 | Sugiyama | G06F 3/1431 345/589 |
| 2013/0308898 A1 | 11/2013 | Doerr et al. | |
| 2017/0194911 A1 | 7/2017 | Aksin | |
| 2017/0280029 A1 * | 9/2017 | Steiner | G06T 11/10 |
| 2018/0220052 A1 * | 8/2018 | Granneman | H04N 23/10 |
| 2019/0097722 A1 * | 3/2019 | McLaurin | G02B 19/0057 |
| 2019/0154439 A1 * | 5/2019 | Binder | G01S 15/42 |
| 2019/0179016 A1 * | 6/2019 | Raring | H01S 5/4087 |
| 2019/0235346 A1 * | 8/2019 | Royon | H01S 5/06226 |
| 2019/0354894 A1 * | 11/2019 | Lazovich | G06E 1/00 |
| 2019/0356394 A1 * | 11/2019 | Bunandar | G02F 1/21 |
| 2019/0362787 A1 | 11/2019 | Lu et al. | |
| 2019/0370652 A1 * | 12/2019 | Shen | G06N 3/0675 |
| 2019/0372589 A1 * | 12/2019 | Gould | H04B 10/25 |
| 2020/0110992 A1 | 4/2020 | Hosseinzadeh et al. | |
| 2020/0142441 A1 | 5/2020 | Bunandar et al. | |
| 2020/0150345 A1 | 5/2020 | Nahmias | |
| 2020/0166328 A1 * | 5/2020 | Zhou | A61B 5/0066 |
| 2020/0250532 A1 * | 8/2020 | Shen | G06N 3/0675 |
| 2020/0250533 A1 | 8/2020 | Shen et al. | |
| 2020/0250534 A1 | 8/2020 | Shen et al. | |
| 2020/0301874 A1 * | 9/2020 | Shainline | G06N 3/067 |
| 2020/0355678 A1 | 11/2020 | Ozdemir et al. | |
| 2021/0157878 A1 * | 5/2021 | Bunandar | G01D 5/345 |
| 2021/0201126 A1 * | 7/2021 | Meng | G06N 3/0464 |
| 2021/0272005 A1 | 9/2021 | King et al. | |
| 2021/0272006 A1 | 9/2021 | King et al. | |
| 2021/0333818 A1 | 10/2021 | Harris et al. | |
| 2021/0336414 A1 * | 10/2021 | Harris | G02B 6/12019 |
| 2021/0365240 A1 | 11/2021 | Harris et al. | |
| 2022/0004029 A1 * | 1/2022 | Meng | G02F 1/025 |
| 2022/0026920 A1 * | 1/2022 | Ebrahimi Afrouzi | G06N 3/0495 |
| 2022/0146753 A1 * | 5/2022 | Zhang | H04J 14/022 |
| 2022/0166522 A1 * | 5/2022 | Paraiso | G02B 6/4268 |
| 2022/0179159 A1 * | 6/2022 | Wu | G02B 6/4204 |
| 2022/0215257 A1 | 7/2022 | Shen et al. | |
| 2023/0018654 A1 * | 1/2023 | Winzer | G02B 6/4292 |
| 2023/0251421 A1 * | 8/2023 | Yasuda | G02B 6/12004 385/14 |

OTHER PUBLICATIONS

Ryan Hamerly et al., "Large-Scale Optical Neural Networks Based on Photoelectric Multiplication," May 16, 2019, Physical Review X, the American Physical Society, pp. 021032-1-9.*

Extended European Search Report dated Apr. 10, 2024, in connection with European Application No. 21796097.

Hamerly et al., Large-Scale Optical Neural Networks Based on Photoelectric Multiplication. Physical Review X. May 16, 2019;9(2):21032-1-10.

Hamerly et al., [Supplementary] Large-scale optical neural networks based on photoelectric Multiplication. Physical Review X. Feb. 21, 2019;9(021032). 11 Pages.

Harris et al., Accelerating artificial intelligence with silicon photonics. 2020 Optical Fiber Communications Conference and Exhibition (OFC). Mar. 8, 2020. 4 Pages. DOI:10.1364/OFC.2020.W3A.3.

Shen et al., Deep learning with coherent nanophotonic circuits. Jun. 12, 2017;11(7):441-446.

TW 110115070, Jul. 1, 2024, Taiwan Notice of Allowance.

PCT/US23/20205, Aug. 25, 2023, International Search Report and Written Opinion.

Taiwan Notice of Allowance dated Jul. 1, 2024, in connection with Taiwan Application No. 110115070, and English translation thereof.

International Search Report and Written Opinion dated Aug. 25, 2023, in connection with International Application No. PCT/US23/20205.

International Search Report and Written Opinion mailed Sep. 22, 2021, in connection with International Application No. PCT/US2021/029150.

International Preliminary Report on Patentability mailed Nov. 10, 2022, in connection with International Application No. PCT/US2021/029150.

Invitation to Pay Additional Fees mailed Jun. 24, 2021, in connection with International Application No. PCT/US2021/029150.

* cited by examiner $$
\begin{vmatrix} M_{11} & M_{12} & M_{13} & \cdots & M_{1N} \\ M_{21} & M_{22} & M_{23} & \cdots & M_{2N} \\ M_{31} & M_{32} & M_{33} & \cdots & M_{3N} \\ \vdots & \vdots & \vdots & \ddots & \vdots \\ M_{N1} & M_{N2} & M_{N3} & \cdots & M_{NN} \end{vmatrix} \times \begin{vmatrix} x_1 \\ x_2 \\ x_3 \\ \vdots \\ x_N \end{vmatrix} = \begin{vmatrix} y_1 \\ y_2 \\ y_3 \\ \vdots \\ y_N \end{vmatrix}
$$

FIG. 7

LED-BASED PHOTONIC COMMUNICATION AND PROCESSING UNIT

CROSS REFERENCE TO RELATED APPLICATIONS

This application claims the benefit under 35 U.S.C. § 119(e) of U.S. Provisional Patent Application Ser. No. "63/336,216", filed on Apr. 28, 2022, and entitled "LED-BASED PHOTONIC PROCESSING UNIT,", which is hereby incorporated by reference herein in its entirety.

FIELD

The present application relates to photonic processing units, and more particularly LED based photonic processing units.

BACKGROUND

Deep learning, machine learning, latent-variable models, neural networks, and other matrix-based differentiable programs are used to solve a variety of problems, including natural language processing and object recognition in images. Solving these problems with deep neural networks typically requires long processing times to perform the required computation. The most computationally intensive operations in solving these problems are often mathematical matrix operations, such as matrix multiplication.

SUMMARY

Some embodiments relate to a photonic device configured to perform a mathematical operation, the photonic device comprising: a modulatable LED configured to emit visible light; a modulatable detector optically coupled to an output of the LED; a controller electrically coupled to both the modulatable LED and the modulatable detector, the controller being configured to encode a first value in light emitted by the LED and a second value in a characteristic of the photodetector; and a receiver configured to determine a result of the mathematical operation based on an electrical signal produced by the modulatable detector.

Some embodiments relate to a photonic device configured to perform a mathematical operation, the photonic device comprising: a modulatable light emitting diode (LED) configured to emit light; a modulatable detector optically coupled to an output of the modulatable LED; a controller electrically coupled to both the modulatable LED and the modulatable detector, the controller being configured to encode a first value in the light emitted by the modulatable LED and to encode a second value in a characteristic of the modulatable detector; and a receiver configured to determine a result of the mathematical operation based on an electrical signal produced by the modulatable detector.

In some embodiments, the photonic device, further comprises a photonic circuit optically coupling the modulatable LED to the modulatable detector.

In some embodiments, the modulatable LED is formed on a first die; the photonic circuit is formed on a second die; the modulatable detector and the controller are formed on a third die; and the first die is disposed on top of the second die and the second die is disposed on top of the third die, and wherein the first die is electrically coupled to the third die through a plurality of vias in the second die.

In some embodiments, the modulatable LED comprises a resonant cavity configured to produce single mode light emission.

In some embodiments, the photonic circuit comprises silicon nitride waveguides and an input grating configured to couple visible light from the modulatable LED into the silicon nitride waveguides.

In some embodiments, the modulatable LED is a first modulatable LED of a plurality of modulatable LEDs, the first value is a value of an input matrix, the modulatable detector is a first modulatable detector of a plurality of modulatable detectors, and the second value is a weighting value of a weighting matrix.

In some embodiments, the plurality of modulatable LEDs comprise a plurality of blue LEDs, a plurality of red LEDs, and a plurality of green LEDs.

In some embodiments, the controller is configured to encode the first value in an intensity of light emitted by the modulatable LED.

In some embodiments, the modulatable detector is a silicon photodetector.

In some embodiments, the controller is configured to encode the second value in a gain of the silicon photodetector.

Some embodiments relate to a method for performing a mathematical operation, the method comprising: generating an encoded optical signal indicative of a first value using a modulatable light emitting diode (LED) configured to emit visible light; setting a characteristic of a modulatable photodetector, optically coupled to the LED, to be indicative of a second value; generating, using the modulatable photodetector, a photocurrent indicative of both the first value and the second value; and determining a result of the mathematical operation based on the photocurrent.

In some embodiments, generating the encoded optical signal comprises encoding the first value in an intensity of light emitted by the modulatable LED.

In some embodiments, generating the encoded optical signal comprises encoding the first value in light emitted by the modulatable LED using gain switching of modulatable LED.

In some embodiments, generating the encoded optical signal comprises encoding the first value in an amplitude of light emitted by the modulatable LED.

In some embodiments, generating the encoded optical signal comprises encoding the first value in a pulse duration of light emitted by the modulatable LED.

In some embodiments, configuring the characteristic of the modulatable photodetector comprises setting a responsivity of the photodetector based on the second value.

In some embodiments, configuring the characteristic of the modulatable photodetector comprises setting a current gain based on the second value.

Some embodiments, relate to a method of fabricating a photonic device, the method comprising: receiving a first semiconductor die having a modulatable light emitting diode (LED) formed thereon, the modulatable LED configured to emit visible light; receiving a second semiconductor die having a photonic circuit formed thereon, the photonic circuit being configured to optically couple visible light through the photonic circuit; receiving a third semiconductor die having a modulatable detector formed thereon; and packaging the first, second, and third semiconductor dies together such that the modulatable detector is optically coupled to an output of the modulatable LED through the photonic circuit.

In some embodiments, packaging the first, second, and third semiconductor dies together comprises vertically packaging the first semiconductor die on the second semiconductor die and vertically packaging the second semiconductor die on the third semiconductor die.

In some embodiments, the third semiconductor die further has a controller formed thereon, the controller being configured to: modulate the modulatable LED to generate light encoded with a first value; and configure a characteristic of the modulatable detector to be indicative of a second value; and the third semiconductor die further has a receiver configured to determine a mathematical operation based on an electrical signal produced by the modulatable detector.

In some embodiments, the photonic circuit is formed of silicon nitride and wherein the photonic circuit is composed of passive optical components.

Some embodiments relate to A photonic device configured to perform a mathematical operation, the photonic device comprising: a first die comprising a modulatable LED configured to emit light; a second die comprising a plurality of modulatable detectors optically coupled to an output of the LED; a third die comprising a photonic tree circuit optically coupling the modulatable LED to the plurality of modulatable detectors, the photonic circuit comprising silicon nitride optical components; a controller electrically coupled to both the modulatable LED and the modulatable detector, the controller being configured to encode a value in light emitted by the modulatable LED and a vector in respective characteristics of the plurality of modulatable photodetectors; and a receiver configured to determine a result of the mathematical operation based on an electrical signal produced by the modulatable detector.

In some embodiments, the first die is disposed on top of the third die and the third die is disposed on top of the second die, and wherein the first die is electrically coupled to the second die through a plurality of vias in the third die.

In some embodiments, the modulatable LED comprises a resonant cavity configured to produce single mode light emission.

In some embodiments, the modulatable LED is a first modulatable LED of a plurality of modulatable LEDs, and the modulatable detector is a first modulatable detector of a plurality of modulatable detectors, and wherein the plurality of modulatable LEDs comprise a plurality of blue LEDs, a plurality of red LEDs, and a plurality of green LEDs.

In some embodiments, the controller is configured to encode the first value in an intensity of light emitted by the modulatable LED.

In some embodiments, the modulatable detector is a silicon photodetector.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in the figure in which they appear.

FIG. 7 illustrates an example of a matrix-matrix multiplication, in accordance with some embodiments.

DETAILED DESCRIPTION

Figure 1:
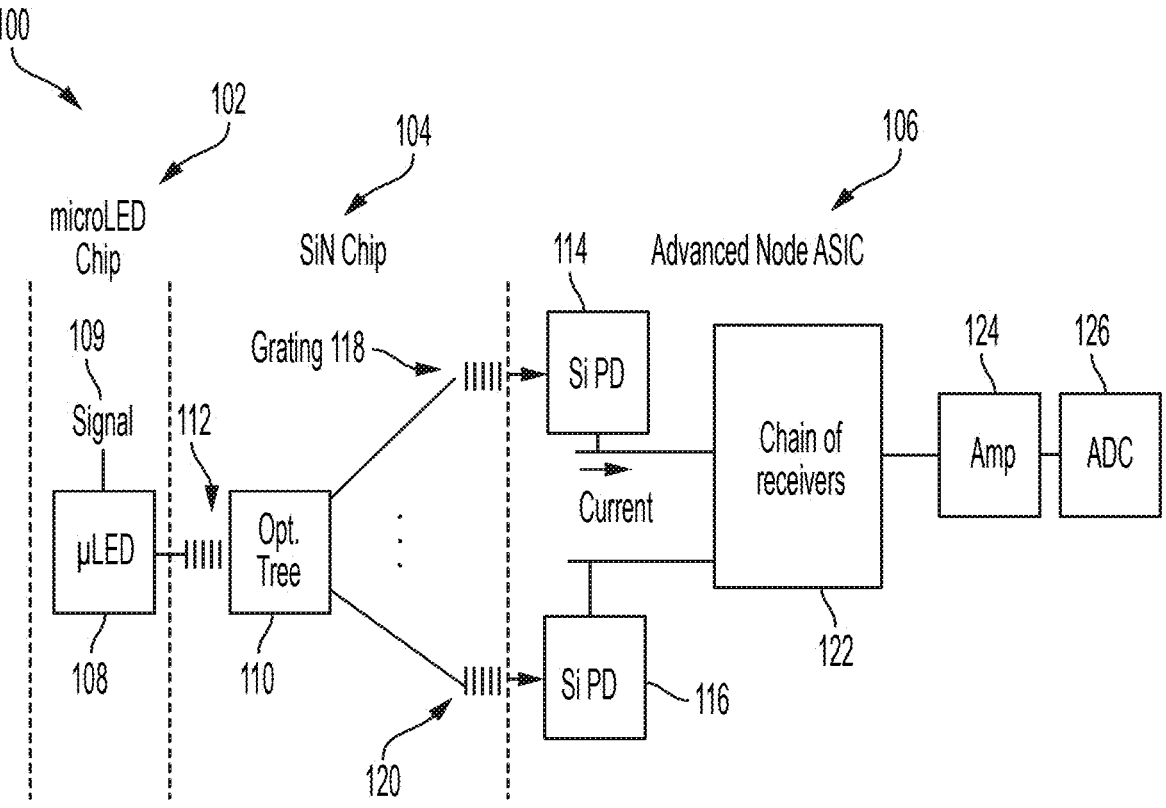
FIG. 1 illustrates an LED based photonic processor, in accordance with some embodiments.

The inventors have recognized and appreciated that implementing a photonic processor to determine matrix operations (e.g., matrix-matrix multiplication or matrix-vector multiplication) using conventional, laser-based photonic arrays presents some challenges. Photonic components, such as waveguides and lasers, may occupy substantially more chip real estate than electronic components, such as transistors. By extension, the processing capabilities of a photonic processor may be limited by the spatial requirements of photonic arrays. Specifically, the spatial requirements associated with encoding and decoding numeric values from optical signals. For example, a photonic processor may include a laser for providing light to an array of optical encoders which may each encode a respective numeric value in the light. Once encoded, light may travel through optical waveguides to optical modulators. The optical modulators may modulate the light in accordance with a second numeric value such that properties of the resulting light are indicative of the result of a mathematical operation between the first numeric value and the second numeric value. Subsequently, a photodetector may detect the properties of the resulting light and by extension the result of the mathematical operation. However, each of the encoder, modulator, waveguides, and detector may each add to the on-chip real estate required for executing a mathematical operation.

The inventors have recognized and appreciated that the on-chip real estate required for executing a mathematical operation may be reduced by reducing the operational wavelength, for example from infrared (IR) to visible light. When working in the IR spectrum, silicon photonics may be an efficient platform for fabricating optical elements, e.g., resonators and waveguides. Additionally, silicon photonics may be fabricated with a high precision, relative to the operational wavelength of silicon photonic systems. However, the operational wavelength of silicon photonic systems is governed by the bandgap of silicon (approximately 1.12 eV) as wavelengths having energies that are above the bandgap are absorbed. In other words, silicon does not support propagation of wavelengths that are smaller than about 1.1 μm. Accordingly, silicon-based waveguides and other devices are not suitable to support operation using visible light.

The inventors have recognized and appreciated that as the operational wavelength gets smaller, the waveguide cross section may also get smaller, reducing on-chip real estate, i.e., the on-chip spatial requirements. Therefore, systems based on non-silicon materials having bandgaps larger than that of silicon may support low loss optical components for visible light systems at a reduced size, thereby reducing the on-chip spatial requirements for computing and increasing the number of computations which may be performed in parallel given a set chip size. For example, silicon nitride photonics may be used for visible photonic systems. Common types of silicon nitride have bandgaps in the range of 4.55 eV-5.30 eV, thus supporting propagation of wavelengths as low as 233 nm.

The inventors have recognized and appreciated that the on-chip spatial requirements for performing mathematical operations may be further reduced, for some applications, by directly encoding input values in the light emission from the light source (as opposed to using external modulators) thus combining the functionality of light generation and first value encoding in the same optical component. Thus, the on-chip spatial requirements may be reduced by using fewer optical elements to encode the first values in light.

The inventors have recognized and appreciated that either in addition to, or as an alternative, to directly encoding the first values in the light emission from the light source, the second values may be directly encoded in the detector such that the functionality of decoding, e.g., detection, of the light emission and the mathematical operation of the first value with the second value are combined. Thus, the on-chip spatial requirements may be reduced by combining the light detection and the performance of mathematical operation in the same optical device.

Accordingly, the inventors have developed a photonic processor configured to perform a mathematical operation that improves the on-chip spatial utilization of the calculation. The photonic device includes a modulatable LED configured to emit light. For example, the modulatable LED may be configured with control circuitry such that the characteristics of light emitted by the LED, e.g., intensity, pulse width or pulse frequency, may be controlled by applying electrical signals to electrodes of the LED. When electrical signals are applied to the electrodes, such as, a voltage difference applied across the electrodes of the LED, light may be emitted when radiative recombination of electrons and holes occurs in the light emitting layer of the LED. The photonic device further includes a modulatable detector optically coupled to an output of the modulatable LED. For example, the modulatable detector may be modulated by changing the sensitivity of the detector to light. The photonic device further includes a controller being electrically coupled to both the modulatable LED and the modulatable detector, where the controller is configured to encode a first value in the light emitted by the modulatable LED and to encode a second value in a characteristic of the modulatable detector. The photonic device further includes a receiver configured to determine a result of the mathematical operation based on the electrical signal produced by the modulatable detector. In some embodiments, the light emitted by the LED may be visible light. In some embodiments, the LED may be configured such that the light emitted is a single optical mode.

For some applications, the use of coherent light improves signal to noise by providing a high-quality single mode for reliable coupling between optical components. The coherent character of the light provides for modulation of the light through phase delay induced interference. However, the inventors have recognized and appreciated that coherent sources (e.g., VCSELs or other lasers) configured to produce visible light are susceptible to low efficiencies, which may increase the power consumption of the photonic processer. Additionally, VCSELs may increase the cost of fabrication and be more difficult to encode through modulation of the intensity, of the light emission, due to the non-linear character of the emission profile associated with stimulated emission. Accordingly, the inventors have developed a photonic processor that includes LED light sources to provide high efficiency visible light generation with modulatable emission.

FIG. 1 illustrates an LED based photonic processor, in accordance with some embodiments. As shown in FIG. 1, photonic processor 100 includes an optical source die 102, optical distribution die 104, and optical detection die 106. Optical source die 102 includes light sources disposed thereon, such as LED 108 which is configured to generate light in response to receiving electrical signals 109. Optical distribution die 104 includes an optical tree 110, e.g., a branched optical distribution circuit, configured to receive light emitted by the optical source die and configured to guide the received light to the optical detection die 106. In some embodiments, optical distribution die 104 includes optical components 104 that are formed of silicon nitride to support the routing of visible light. The optical detection die 106 includes photodetectors 114 and 116, chain of receivers 122, amplifier 124, and analog-to-digital converter (ADC) 126. In some embodiments, photodetectors 114 and 116 are silicon photodetectors configured to support the detection of visible light.

Optical source die 102 may include light sources configured to produce incoherent light, such as a light emitting diode. In some embodiments, optical source die 102 includes LED 108. In some embodiments, LED 108 may be configured to produce single mode emission. For example, LED 108 may include a mirror or cavity, e.g., to provide a resonant wavelength, to produce optical feedback such that the LED operates with single mode emission. In some embodiments, the single mode emission may be partially coherent. In addition, the mode of light emitted by the LED and coupled into the waveguide may be multi-mode or single mode.

In some embodiments, LED 108 may be a visible LED, e.g., an LED configured to emit light at a wavelength, or a band of wavelengths, between 380 and 750 nm. For example, LED 108 may be a blue LED configured to emit light having a wavelength between approximately 450 and 495 nm. As another example, LED 108 may be a green LED configured to emit light having a wavelength between approximately 500 and 570 nm. As another example, LED 108 may be a red LED configured to emit light having a wavelength between approximately 620 and 750 nm.

In some embodiments, LED 108 may be a micro-LED (μLED). A μLED may be an LED with a width less than 100 μm. For example, a μLED may be a square having a width of 50 μm. As another example a μLED may be a square having a width between 3 and 15 μm. The size of the μLED and its emission mode can determine whether the emission is single mode or multi-mode. Further, the LED can be configured in an array fashion, as described herein.

In some embodiments, LED 108 may include a resonant cavity configured to produce single mode light emission from the LED. For example, LED 108 may include a low finesse cavity configured to suppress multiple emitting modes in the LED emission. As another example, LED 108 may include a high finesse cavity such that the LED emission is a single mode with a narrow line width.

Figures 2, 3:
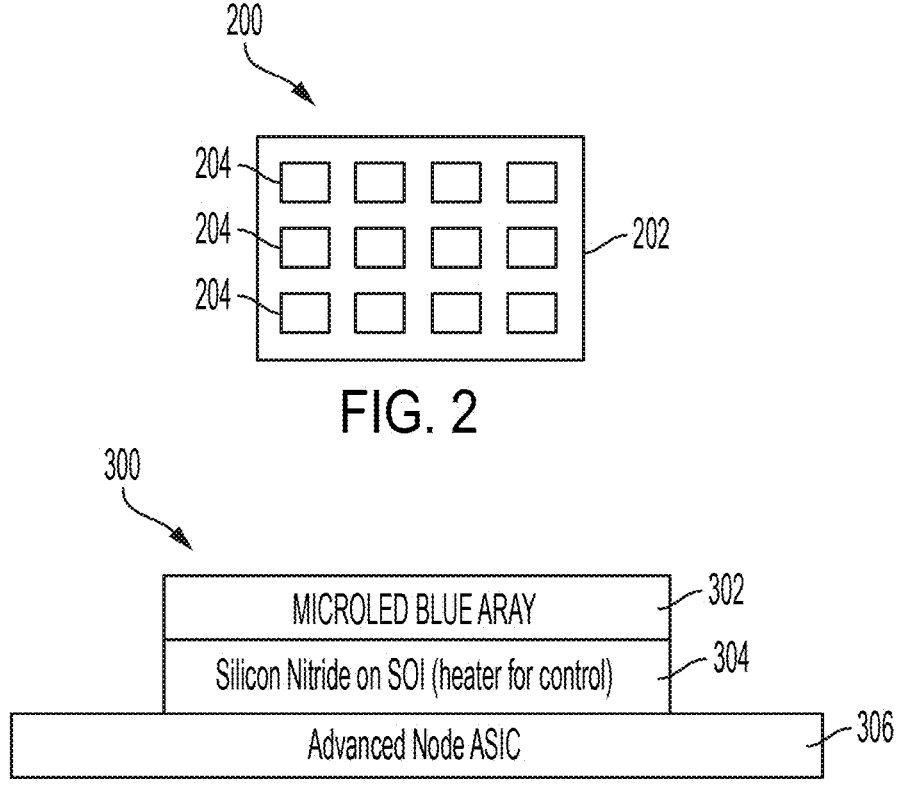
FIG. 2 illustrates a top view of a photonic processor that includes an array of LED and photonic chip stacks disposed on an optical detection die, in accordance with some embodiments.
FIG. 3 illustrates a side view of a vertical configuration of a photonic processor, in accordance with some embodiments.

FIG. 2 illustrates a top view of a photonic processor 200 that includes an array of LED and photonic chip stacks disposed on an optical detection die, in accordance with some embodiments. Photonic processor 200 includes LED and photonic chip stacks 204 disposed on optical detection die 202. LED and photonic chip stacks 204 include an optical source die 102 having an LED disposed thereon packaged with an optical distribution die 104 in a stacked configuration. The photonic chip stacks 204 are disposed on optical detection die 202 such that each LED and photonic chip stack is configured to operate as a separate processor photonic core. Optical detection die 202 includes photodetectors and advanced-node ASIC configured to control operation of LED and photonic chip stack. Optical detection die 202 may be implemented as described in connection with optical detection die 106.

As shown in FIG. 2, LED and photonic chip stacks 204 include 12 chip stacks corresponding to 12 photonic cores (although other numbers are also possible). In some embodiments, the photonic processor may include a single chip stack.

In some embodiments, an advanced-node ASIC is fabricated using a process node smaller than 25 nm, smaller than 12 nm, smaller than 9 nm, or smaller than 4 nm. In some embodiments, other process nodes may be used, as aspects of the technology described herein are not limited in this respect.

FIG. 3 illustrates a side view of a vertical configuration of a photonic processor 300, in accordance with some embodiments. Photonic processer 300 includes an optical source die 302, optical distribution die 304, and an optical detection die 306 which may be implemented as described in connection with FIG. 1. The photonic processor dies 302, 304, and 306 are configured as a vertically stacked package such that the optical distribution die 304 is disposed between the optical source die 302 and the optical detection die 306.

Optical source die 302 includes an array of LEDs. In some embodiments, the array of LEDs is configured to emit visible light, as described herein. For example, the array of LEDs may be configured to emit blue light. In some embodiments, the LEDs on optical source die 302 may be configured to emit light from a single surface, such as a top or bottom surface, such that the light is emitted towards the optical distribution die 304.

As shown in FIG. 3, optical distribution die 304 is configured to couple light emitted from the optical source die 302 to the optical detection die 306. The optical distribution die includes waveguides configured to distribute the light from the optical source die into multiple detection channels. In some embodiments, the optical distribution die 304 includes optical components formed of silicon nitride to provide the routing of visible light. In some embodiments, optical distribution die 304 may only include passive optical components, such as waveguides for routing light through the optical distribution die from the optical source die to the optical detection die. In some embodiments, optical distribution die 304 may include both passive and active optical components, where the passive optical components route light through the optical distribution die and the active optical components may include heaters for controlling the light being routed through the optical distribution die.

A mathematical operation may be performed using a photonic processor such as the photonic processors described herein. The method for performing the mathematical operation including generating an encoded optical signal indicative of a first value using a modulatable LED configured to emit visible light; setting a characteristic of a modulatable photodetector, optically coupled to the LED, to be indicative of a second value; generating, using the modulatable photodetector, a photocurrent indicative of both the first value and the second value; and determining a result of the mathematical operation based on the photocurrent.

Figure 4:
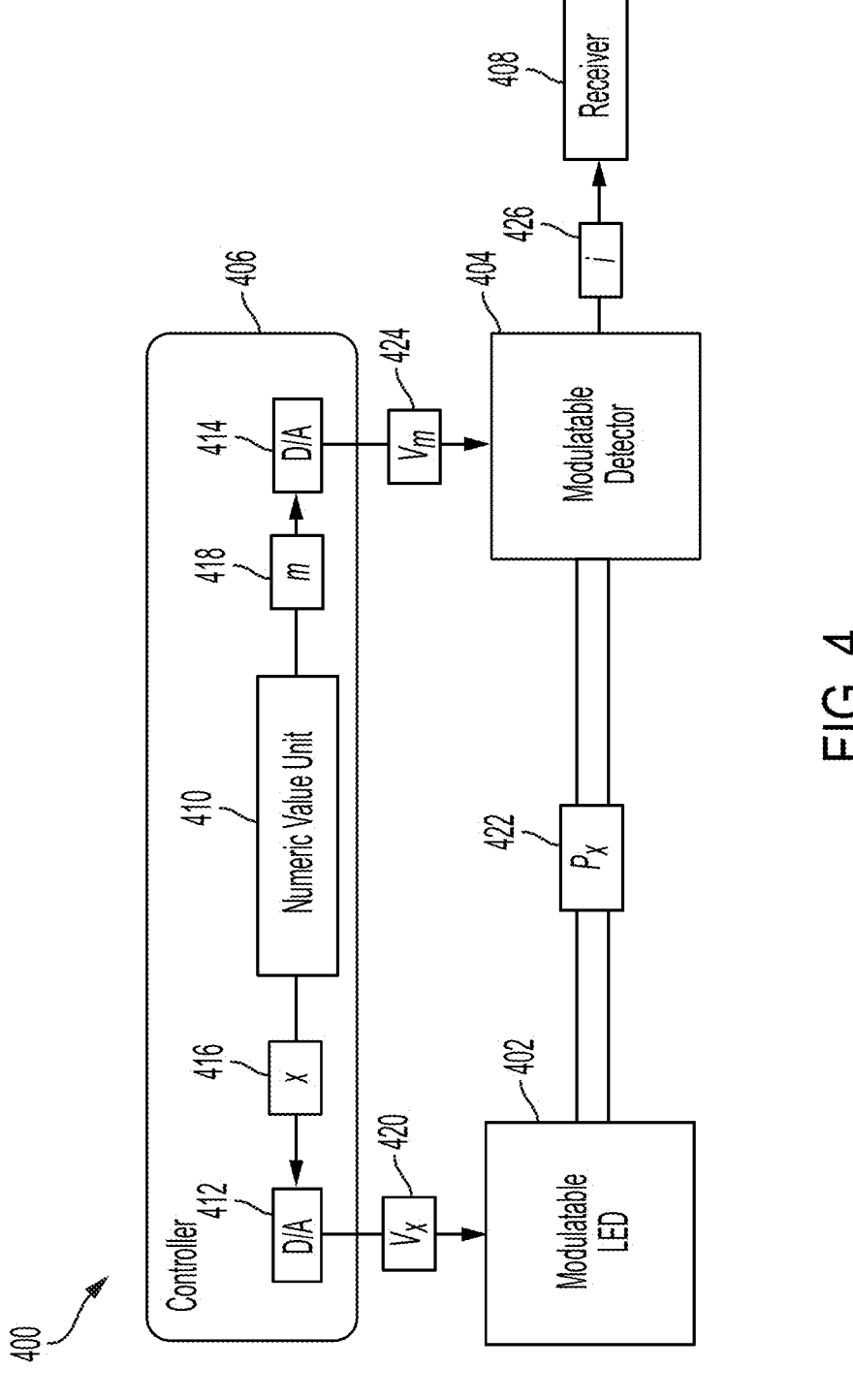
FIG. 4 is a block diagram illustrating an optical multiplier based on a modulatable detector and an LED, in accordance with some embodiments.

FIG. 4 is a block diagram illustrating an optical multiplier 400 based on a modulatable detector and an LED, in accordance with some embodiments. Optical multiplier 400 includes a modulatable light source 402, a modulatable detector 404, a receiver 408, and a controller 406. Controller 407 includes a numeric value unit 410 and a pair of digital-to-analog converters (DAC) 412 and 414.

Numeric value unit 410 produces a pair of numeric outputs 416 and 418. In some embodiments, numeric outputs 416 and 418 are numeric scalar values. For example, numeric value 416 and 418 may be scalar numeric values x and m, respectively. Numeric value m may also be referred to as a "weight" or "weight parameter" and numeric value x is also referred to herein as "input data," "input value," or "input parameter." These numeric values may be produced based on data received by the controller 406, include data obtained from a memory internal to controller 406 and/or data provided to controller 406 from another computing system. These numeric values may be represented using any digital representation, including fixed-point or floating-point representations. The first DAC 412 converts numeric output 416 to an electrical signal 420 representative of x. For example, the first DAC 412 produces a voltage $V_x$ from numeric value x. The second DAC 414 converts numeric output 418 to an electrical signal 424 representative of m. For example, the second DAC 414 produces a voltage $V_m$ from numeric value m. In some embodiments, $V_x$ is proportional to x. In some embodiments, $V_m$ is proportional to m. The optical multiplier 400 of FIG. 4 is configured to multiply these numeric values to one another, thereby producing the result x×m.

It should be appreciated that, while FIG. 4 illustrates an architecture in which the signals representing numeric values to be multiplied are voltages ($V_x$ and $V_m$), in other embodiments, the numeric values may be represented using other types of electrical signals, such as electrical currents or electrical charges.

Modulatable light source 402 may be implemented using an incoherent source, e.g., an LED. Alternatively, modulatable light source 402 may be implemented using a partially coherent light source, e.g., a superfluorescent diode. Alternatively, modulatable light source 402 may be implanted using a coherent light source, e.g., a laser. As used herein, the terms "coherence" and "coherent" refer to temporal coherence. The modulated optical power 422 produced by modulatable light source 402 is identified as $P_x$.

Modulatable light source 402 generates an encoded optical signal having power $P_x$ that is proportional to the numeric value x. Modulatable light source 402 may be implemented using an LED configured to generate light encoded with numeric value x producing modulated optical power 422.

Encoding of the numeric value x in the optical power 422 is achieved by driving the light generation of the LED using the voltage 420 produced by the first DAC 412. In some embodiments, the numeric value x is encoded in the intensity of the light emitted by the modulatable LED.

In some embodiments, the numeric value x is encoded in the pulse amplitude of light. In some embodiments, gain switching can be used to generate short duration pulses of light emission. Numeric value x may be encoded in pulsed emission through amplitude or pulse width modulation. For example, the numeric value x may be encoded in the pulse amplitude by modulating the amplitude of the emitted light pulses. As another example, the numeric value may be encoded in the pulse width by modulating the duration of emitted light pulses.

Modulatable detector 404 multiplies numeric value x by numeric value m. Multiplication is achieved by producing a photocurrent i that is proportional to both $P_x$ and m (by way of voltage $V_m$). Modulatable detector 404 is configured to receive an optical signal having power P as in input. In response to receiving the optical signal, detector 404 produces a photocurrent i. The photocurrent i is related to the input optical power by the following expression: i=P/R where R is the responsivity of the modulatable detector. In addition to being dependent upon power P, the photocurrent is also dependent upon control voltage V (or, in other embodiments, another type of electrical signal such as a control current). Detector 404 is preceded by the term "modulatable" to indicate that the photocurrent can be modulated through the application of a control electrical signal.

In some embodiments, modulatable detector 404 includes a photodetector and a gain stage. The photodetector may be implemented using any suitable type of photo-sensitive device, for example a photoconductor, a photodiode, an avalanche photodiode, a phototransistor, a photomultiplier (e.g., a photomultiplier tube), a superconducting detector, or a graphene-based detector. As another example, the photo-detector may be implemented using any other suitable type of photo-sensitive device, as aspects of the technology described herein are not limited in this respect.

The gain stage may be implemented using any suitable type of amplifier, for example a current amplifier for amplifying the current generated by photodetector. As another example, the gain stage may be implemented using any other suitable type of amplifier, as aspects of the technology described herein are not limited in this respect.

In some embodiments, modulating a characteristic of modulatable detector 404 may involve modulating, using voltage V (or using a control current), the responsivity of the photodetector, and/or the gain (e.g., current gain) or impedance of the gain stage.

In some embodiments, which utilize a dual-rail configuration the modulatable detector may include two photodetectors and two gain stages. For example, each rail may be optically coupled to a single photodetector, however the two photodetectors (one for each rail) may each be coupled to both of the gain stages.

Receiver 408 includes a trans-impedance amplifier and an analog-to-digital converter (ADC). Receiver 408 produces an output numeric value y that is equal to the product of x times m.

In some embodiments, the detector 404 may not be modulatable. In this case, the LEDs can be used to distribute data/signal "x" to multiple locations within the ASIC die, e.g., the optical detection die. A control voltage may still be applied to each photodetector to bias it for the best signal-to-noise ratio (SNR).

Figure 5:
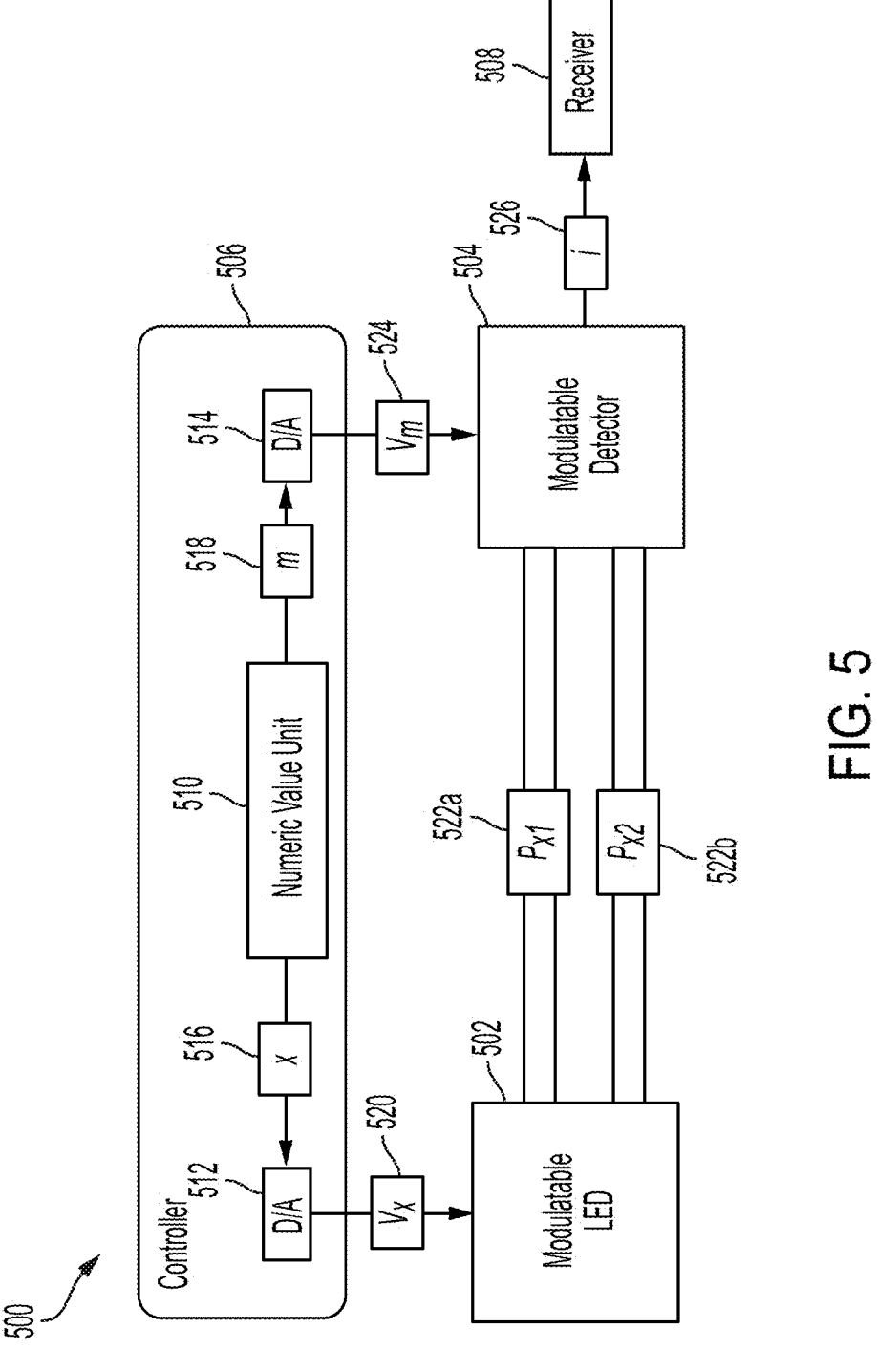
FIG. 5 is a block diagram illustrating an optical multiplier based on a dual-rail modulatable detector and an LED, in accordance with some embodiments.

FIG. 5 is a block diagram illustrating an optical multiplier 500 based on a dual-rail modulatable detector and an LED, in accordance with some embodiments. Optical multiplier 500 may be implemented as described in connection with optical multiplier 400. The controller 506, numeric value unit 510, DACs 512 and 514 are configured to generate voltage 520 from input value 516 and voltage 524 from weighing value 518, as described above in connection with FIG. 4.

Differential optical encoding with optical multiplier 500 involves receiving voltage $V_x$, and in response, producing a pair of encoded optical signals 522a and 522b. The encoding may be reflected in the powers of optical signals 522a and 522b as $Px_1$ and $P_{x2}$, respectively. In some embodiments, differential optical encoding involves producing a pair of optical signals in such a way that the difference between the powers to the optical signals $(Px_1 - P_{x2})$ is proportional to value 516, X. It should be appreciated that this architecture is referred to as "dual-rail" in that x is encoded in the difference between two optical signals (the difference in the signal powers as in this example, or in other examples, the difference between the signal amplitudes). Differential optical encoding may be implemented using two modulatable LEDs such that modulatable LED 502 includes a first modulatable LED coupled to a first rail and a second modulatable LED coupled to a second rail. Each rail may have a respective photodiode at modulatable detector 504. In other embodiments, a single modulatable LED may generate an optical signal which is then split between the two rails using any suitable optical modulator, including an optical interferometer (such as a tunable directional coupler or a Mach-Zehnder interferometer), a resonant modulator, a Franz-Keldysh modulator, etc. In other embodiments, other optical modulators may be used, as aspects of the technology described herein are not limited in this respect.

Figure 6:
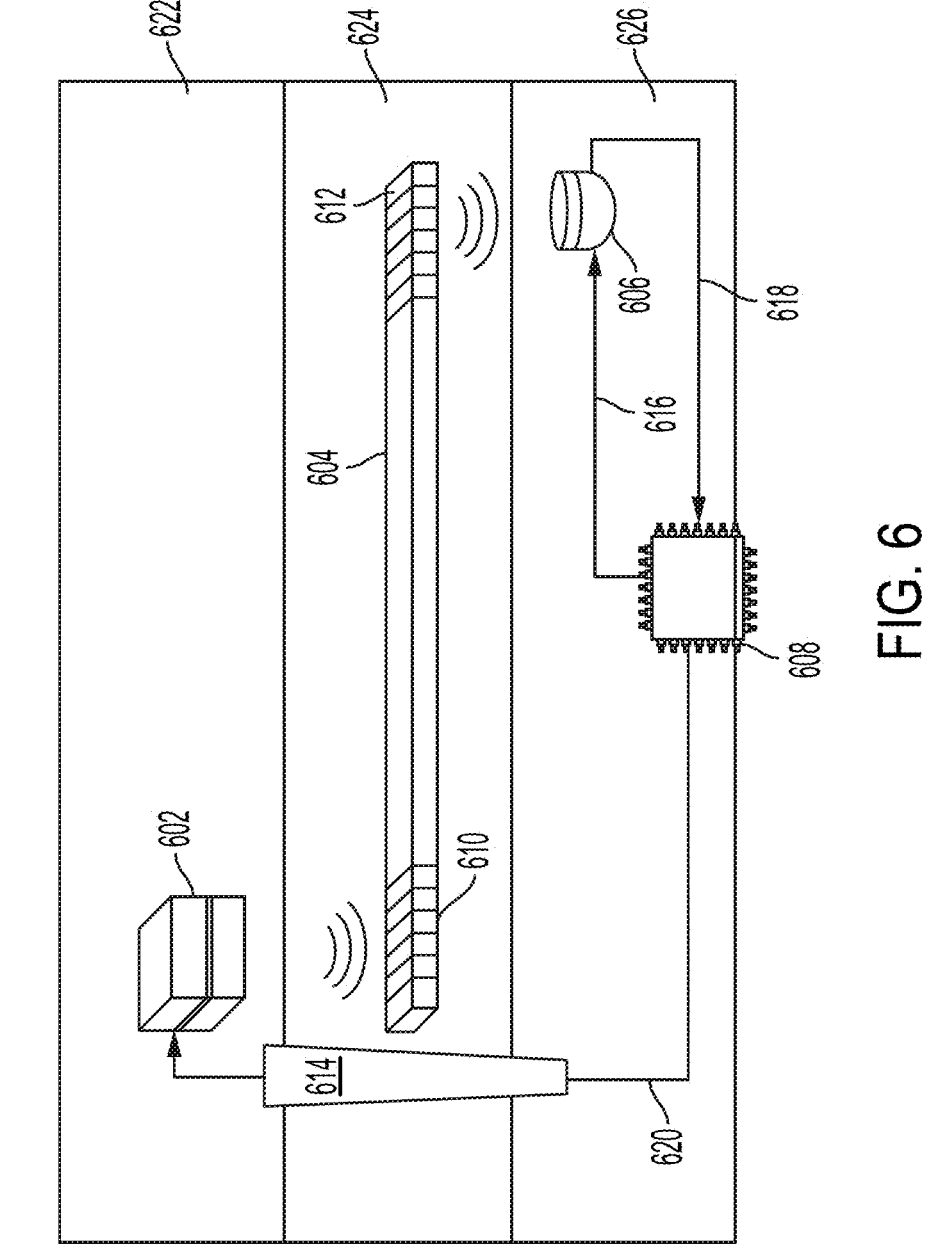
FIG. 6 illustrates a schematic diagram of photonic processor including separate optical source die, optical distribution die, and optical detection die, in accordance with some embodiments.

FIG. 6 illustrates a schematic diagram of photonic processor 600 including separate optical source die, optical distribution die, and optical detection die, in accordance with some embodiments. As shown in FIG. 6, photonic processor 600 includes modulatable LED 602 fabricated on optical source die 622. Optical source die 622 is disposed on optical distribution die 624, which includes waveguide 604. Optical distribution die 624 is disposed on optical detection die 626 which includes modulatable detector 606. The three dies are packaged such that the optical source die 622 is in electrical contact with the optical detection die 626 through via 614 fabricated through the optical distribution die 624. Furthermore, the three dies are packaged such that the optical emission from modulatable LED 602 couples into waveguide 604 through grating 610. Waveguide 604 may be a component of a branched optical distribution system to split the optical emission from LED 602 into multiple waveguide outputs which may independently be coupled into detectors on the optical detection die 626. For example, the waveguide output of waveguide 604 includes optical grating 612 which is configured to couple light out of waveguide 604 and towards modulatable detector 606. In some embodiments, waveguide 604 may be a silicon nitride waveguide configured to route visible light, as described herein.

Although illustrated as having a single modulatable LED, optical source die 622 may include an array of LEDs for encoding in input matrix, or vector, into separate optical signals each being coupled into a respective end of a waveguide on the optical distribution die 624 to be distributed to an array of modulatable detectors. The placement of the array of LEDs may be correlated with specific memory blocks (e.g., SRAM or buffer) or specific compute blocks within the ASIC such that 614 may be a through-via. If the LED cannot be reached vertically straight, a redistribution metal layer (or RDL) may be required either in die 622, die 624, or die 626.

In some embodiments, a processor 608 is disposed on the optical detection die 626, the processor 608 being electrically coupled to the modulatable LED through electrical traces 620 (shown to have RDL) and through via 614 and further being electrically coupled to the modulatable detector to send and receive signals through electrical traces 616 and 618, respectively. The processor 608 may be configured to operate as a controller to encode a value in light emitted by the modulatable LED and to encode a vector in respective characteristics of the detectors on the optical detection die, as described herein. The processor 608 may be further configured to operate as a receiver configured to determine a result of the mathematical operation produced by the modulatable detector. For example, processor 608 may include modulatable detectors of the types described herein.

The multipliers of FIGS. 4 and 5 perform scalar multiplication (x times m). However, many machine learning algorithms rely on matrix-matrix (e.g., matrix-vector) multiplication. Some embodiments relate to photonic processors configured to perform matrix-matrix (e.g., matrix-vector) multiplications using the dual-rail optical multipliers described above. These photonic processors are configured to multiply a matrix M by a vector X to produce a vector Y. Matrix M is also referred to herein as a "weight matrix," vector X is also referred to herein as an "input vector," and vector Y is also referred to herein as an "output vector."

FIG. 7 illustrates an example of a matrix-matrix multiplication, in accordance with some embodiments. In this example, M is an N×N matrix, e.g., a square matrix. Although illustrated as a square matrix, in some embodiments, M may have any suitable dimensionality, e.g., a rectangular matrix, as aspects of the technology described herein are not limited in this respect.

Figure 8A:
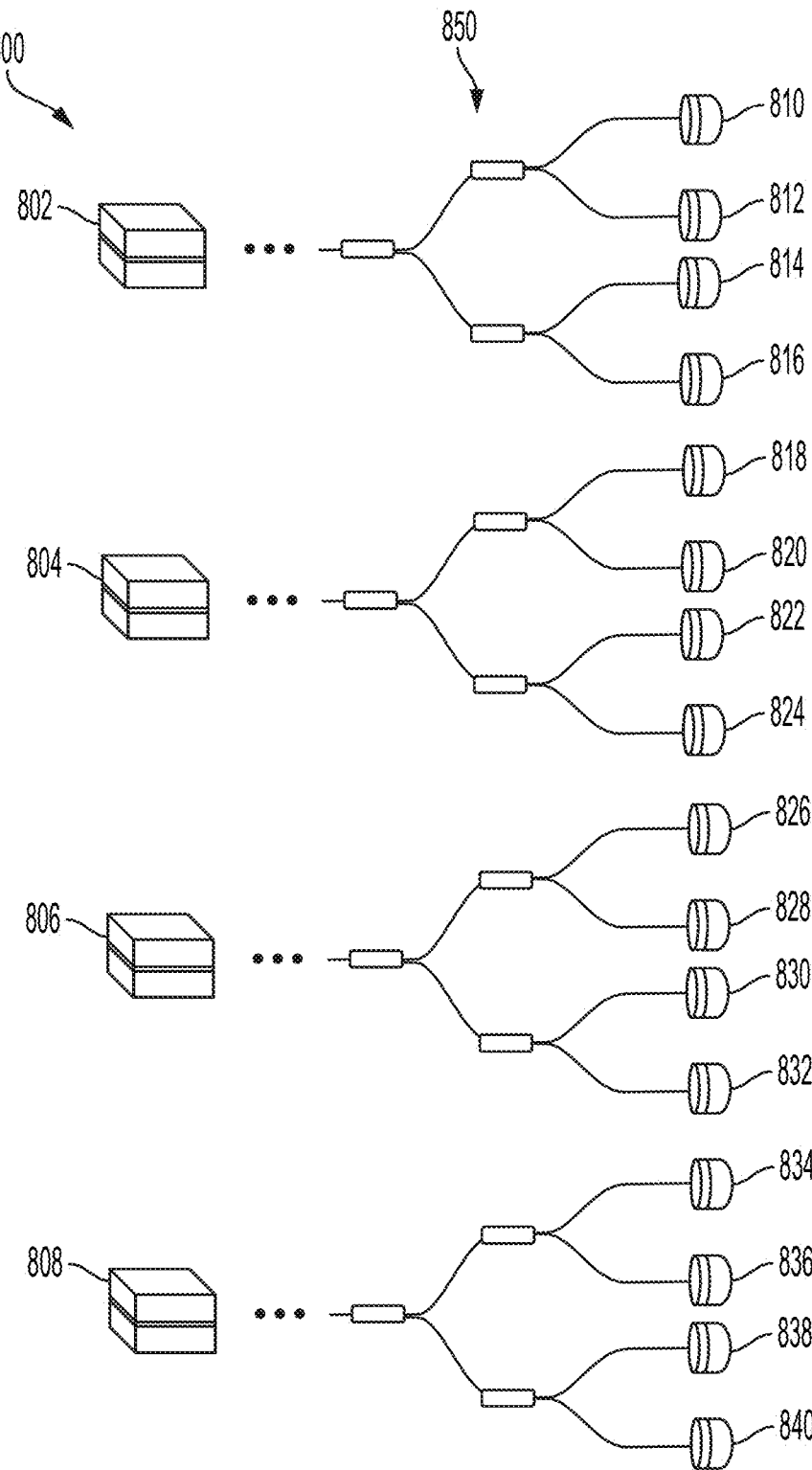
FIG. 8A illustrates a photonic processor configured to perform matrix-matrix multiplication, in accordance with some embodiments.

FIG. 8A illustrates a photonic processor configured to perform matrix-matrix multiplication, in accordance with some embodiments. In this implementation, the photonic processor is configured to multiply a 4×4 matrix (M) by a 4×1 input vector (X) to obtain a 4×1 output vector (Y). As shown in FIG. 8A, the photonic processor includes modulatable LEDs 802, 804, 806, and 808; modulatable detectors 810, 812, 814, 816, 818, 820, 822, 824, 826, 828, 830, 832, 834, 836, 838, 840; and optical tree 850. The modulatable LEDs, modulatable detectors, and optical tree may be configured to be operated in the manner described in connection with the photonic processors of FIGS. 1-6.

During operation of the photonic processor to perform matrix-matrix multiplication, first modulatable LED 802 is configured to generate light encoded with numeric value $x_1$ in response to receiving an input voltage $V_{x1}$. The encoding light generated by modulatable LED 802 has an optical power $P_{x1}$ which is provided to modulatable detectors 810, 812, 814, and 816 through optical tree 850. A characteristic of the modulatable detectors is encoded with an element of the weight matrix by modulating the sensitivity of the detector in response to a weight voltage $V_m$, where the weight voltage is proportional to an element of the weight matrix. In accordance with the embodiment illustrated in FIG. 8A, the sensitivity of modulatable detector 810 may be configured to be proportional to $M_{11}$ in response to receiving a weight voltage $V_{M11}$. Accordingly, in response to receiving encoded light proportional to $P_{x1}$ and weight voltage $V_{M11}$, modulatable detector 810 generates photocurrent $i_{M11x1}$. The sensitivity of modulatable detector 812 may be configured to be proportional to $M_{12}$ in response to receiving a weight voltage $V_{M12}$. Accordingly, in response to receiving encoded light proportional to $P_{x1}$ and weight voltage $V_{M12}$, modulatable detector 812 generates photocurrent $i_{M12x1}$. The sensitivity of modulatable detector 814 may be configured to be proportional to $M_{13}$ in response to receiving a weight voltage $V_{M13}$. Accordingly, in response to receiving encoded light proportional to $P_{x1}$ and weight voltage $V_{M13}$, modulatable detector 814 generates photocurrent $i_{M13x1}$. The sensitivity of modulatable detector 816 may be configured to be proportional to $M_{14}$ in response to receiving a weight voltage $V_{M14}$. Accordingly, in response to receiving encoded light proportional to $P_{x1}$ and weight voltage $V_{M14}$, modulatable detector 816 generates photocurrent $i_{M14x1}$. A chain of receivers may be configured to amplify and sum each respective photocurrent such that a signal $i_{y1}$ is generated and is proportional to the sum of the photocurrents, e.g., $i_{y1}=i_{M11x1}+i_{M12x1}+i_{M13x1}+i_{M14x1}$.

Second modulatable LED 804 is configured to generate light encoded with numeric value $x_2$ in response to receiving an input voltage $V_{x2}$. The encoding light generated by modulatable LED 804 has an optical power $P_{x2}$ which is provided to modulatable detectors 818, 820, 822, and 824 through optical tree 850. In accordance with the embodiment illustrated in FIG. 8A, the sensitivity of modulatable detector 818 may be configured to be proportional to $M_{21}$ in response to receiving a weight voltage $V_{M21}$. Accordingly, in response to receiving encoded light proportional to $P_{x2}$ and weight voltage $V_{M21}$, modulatable detector 818 generates photocurrent $i_{M21x2}$. The sensitivity of modulatable detector 820 may be configured to be proportional to $M_{22}$ in response to receiving a weight voltage $V_{M22}$. Accordingly, in response to receiving encoded light proportional to $P_{x2}$ and weight voltage $V_{M22}$, modulatable detector 820 generates photocurrent $i_{M22x2}$. The sensitivity of modulatable detector 822 may be configured to be proportional to $M_{23}$ in response to receiving a weight voltage $V_{M23}$. Accordingly, in response to receiving encoded light proportional to $P_{x2}$ and weight voltage $V_{M23}$, modulatable detector 822 generates photocurrent $i_{M23x2}$. The sensitivity of modulatable detector 824 may be configured to be proportional to $M_{24}$ in response to receiving a weight voltage $V_{M24}$. Accordingly, in response to receiving encoded light proportional to $P_{x2}$ and weight voltage $V_{M24}$, modulatable detector 824 generates photocurrent $i_{M24x2}$. A chain of receivers may be configured to amplify and sum each respective photocurrent such that a signal $i_{y2}$ is generated and is proportional to the sum of the photocurrents, e.g., $i_{y2}=i_{M21x2}+i_{M22x2}+i_{M23x2}+i_{M24x2}$.

Third modulatable LED 806 is configured to generate light encoded with numeric value $x_3$ in response to receiving an input voltage $V_{x3}$. The encoding light generated by modulatable LED 806 has an optical power $P_{x3}$ which is provided to modulatable detectors 826, 828, 830, and 832 through optical tree 850. The sensitivity of modulatable detector 826 may be configured to be proportional to $M_{31}$ in response to receiving a weight voltage $V_{M31}$. Accordingly, in response to receiving encoded light proportional to $P_{x3}$ and weight voltage $V_{M31}$, modulatable detector 826 generates photocurrent $i_{M31x3}$. The sensitivity of modulatable detector 828 may be configured to be proportional to $M_{32}$ in response to receiving a weight voltage $V_{M32}$. Accordingly, in response to receiving encoded light proportional to $P_{x3}$ and weight voltage $V_{M32}$, modulatable detector 828 generates photocurrent $i_{M32x3}$. The sensitivity of modulatable detector 830 may be configured to be proportional to $M_{33}$ in response to receiving a weight voltage $V_{M33}$. Accordingly, in response to receiving encoded light proportional to $P_{x3}$ and weight voltage $V_{M33}$, modulatable detector 830 generates photocurrent $i_{M33x3}$. The sensitivity of modulatable detector 832 may be configured to be proportional to $M_{34}$ in response to receiving a weight voltage $V_{M34}$. Accordingly, in response to receiving encoded light proportional to $P_{x3}$ and weight voltage $V_{M34}$, modulatable detector 832 generates photocurrent $i_{M34x3}$. A chain of receivers may be configured to amplify and sum each respective photocurrent such that a signal $i_{y3}$ is generated and is proportional to the sum of the photocurrents, e.g., $i_{y3}=i_{M31x3}+i_{M32x3}+i_{M33x3}+i_{M34x3}$.

Fourth modulatable LED 808 is configured to generate light encoded with numeric value $x_4$ in response to receiving an input voltage $V_{x4}$. The encoding light generated by modulatable LED 808 has an optical power $P_{x4}$ which is provided to modulatable detectors 834, 836, 838, and 840 through optical tree 850. The sensitivity of modulatable detector 834 may be configured to be proportional to $M_{41}$ in response to receiving a weight voltage $V_{M41}$. Accordingly, in response to receiving encoded light proportional to $P_{x4}$ and weight voltage $V_{M41}$, modulatable detector 834 generates photocurrent $i_{M41x4}$. The sensitivity of modulatable detector 836 may be configured to be proportional to $M_{42}$ in response to receiving a weight voltage $V_{M42}$. Accordingly, in response to receiving encoded light proportional to $P_{x4}$ and weight voltage $V_{M42}$, modulatable detector 836 generates photocurrent $i_{M42x4}$. The sensitivity of modulatable detector 838 may be configured to be proportional to $M_{43}$ in response to receiving a weight voltage $V_{M43}$. Accordingly, in response to receiving encoded light proportional to $P_{x4}$ and weight voltage $V_{M43}$, modulatable detector 838 generates photocurrent $i_{M43x3}$. The sensitivity of modulatable detector 840 may be configured to be proportional to $M_{44}$ in response to receiving a weight voltage $V_{M44}$. Accordingly, in response to receiving encoded light proportional to $P_{x4}$ and weight voltage $V_{M44}$, modulatable detector 840 generates photocurrent $i_{M44x4}$. A chain of receivers may be configured to amplify and sum each respective photocurrent such that a signal $i_{y4}$ is generated and is proportional to the sum of the photocurrents, e.g., $i_{y4}=i_{M41x4}+i_{M42x4}+i_{M43x4}+i_{M44x4}$.

The output vector Y may be generated from the resulting photocurrents using an ADC. In some embodiments, an amplifier may be included to amplify the photocurrents prior to processing by the ADC. In some embodiments, it may be advantageous to sum the photocurrents in the analog domain as the summation can be performed quickly with relatively few elements. However, in other embodiments, it may be advantageous to determine numeric values represented by each respective photocurrent. Accordingly, in some embodiments, rather than summing the respective photocurrents together to generate a signal proportional to an element of the output vector, e.g., $i_{yj}$ (where j is an indexing integer), the respective photocurrents may be individually processed from analog to digital signals, e.g., processed using an ADC, prior to summing the respective photocurrents together. In embodiments which process the respective photocurrents individually, the summing of photocurrent to determine elements of the output vector may be performed in the digital domain.

Although FIG. 8A is illustrated as a photonic processor that is configured to multiply a 4×4 matrix (M) by a 4×1 input vector (X) to obtain a 4×1 output vector (Y), the photonic processer illustrated in FIG. 8A may be configured to process larger matrices and/or vectors. In some embodiments, matrix-matrix multiplication utilizes block matrix multiplication to decompose large matrixes into smaller submatrices which can be subsequently reconstructed to produce the result of the larger matrix computation.

Additionally, the speed at which photonic processors can compute matrix-matrix operations is proportional to the number of matrix elements that can be computed in parallel. For photonic processors that use modulatable light sources and modulatable detectors to encode the initial values and the weighting values, the number of matrix elements that can be computed in parallel will depend on the number of modulatable light sources and the number of modulatable detectors. In some embodiments, the size and dimensionality of the input matrix will depend on the number of modulatable light sources while the size and dimensionality of the weighting matrix will depend on the number of modulatable detectors.

Figure 8B:
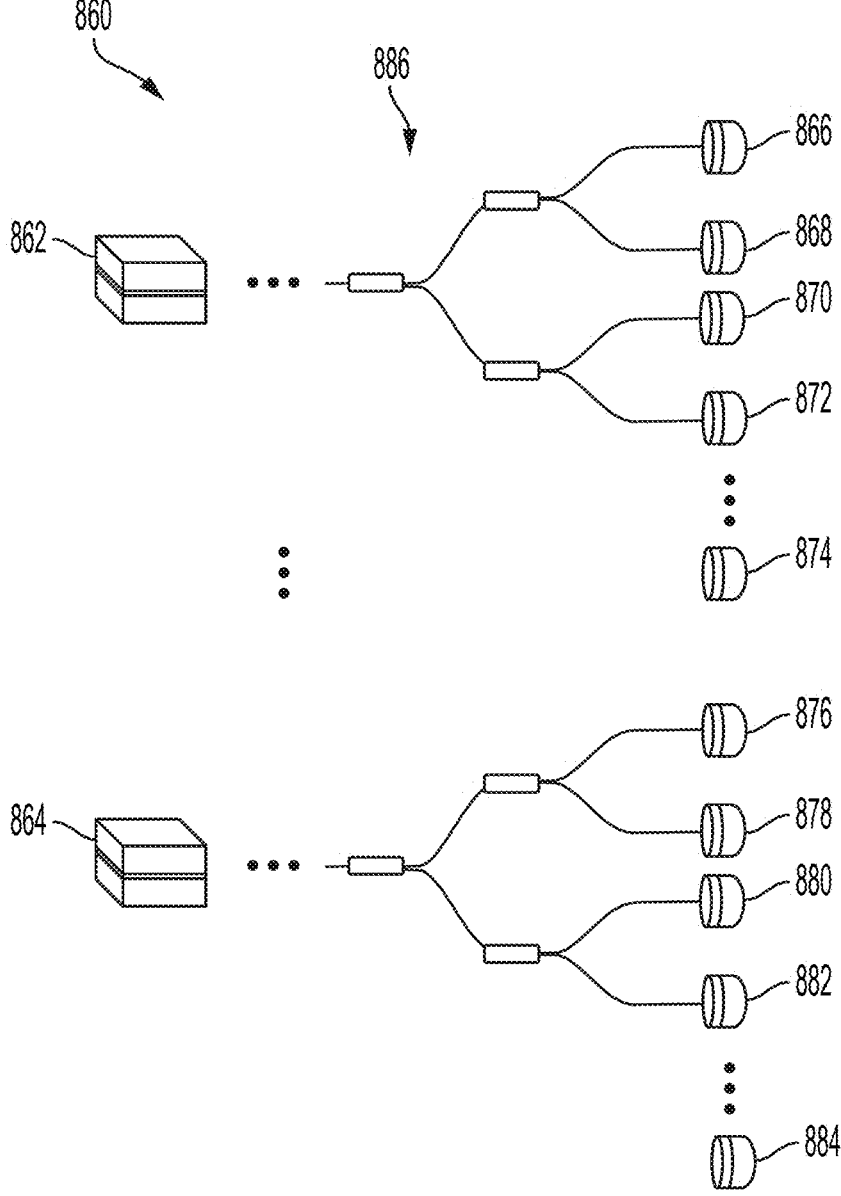
FIG. 8B illustrates an m×n photonic processor configured to perform matrix-matrix multiplication, in accordance with some embodiments.

FIG. 8B illustrates an m×n photonic processor 860 configured to perform matrix-matrix multiplication, in accordance with some embodiments. Photonic processor 860 includes modulatable light sources 862 and 864; optical tree 886; and modulatable detectors 866, 868, 870, 872, 874, 876, 878, 880, 882, and 884. In some embodiments, modulatable light sources, optical tree, and modulatable detectors of photonic processor 860 may be implemented as described in connection with photonic processor 800, illustrated in FIG. 8A.

As shown in FIG. 8B, modulatable light source 862 is a first light source and modulatable light source 864 is an $n^{th}$ light source. In some embodiments, the size of the input matrix that can be processed in parallel is determined by the number of modulatable light sources. For example, modulatable light sources 862, 864, and any intervening modulatable light sources are configured to generate light encoded with n numeric values. In some embodiments, the n numeric values may correspond to the elements of a matrix. For example, the n numeric values may be a one-dimensional input array x having a length N, as shown in equation 1. Accordingly, a photonic processor having N modulatable light sources could encode the full input array in parallel.

$$x = \begin{bmatrix} x_1 \\ x_2 \\ \vdots \\ x_N \end{bmatrix} \qquad \text{Equation 1}$$

As another example, the n numeric values may be a two-dimensional input array x having a dimensionality of N×N, as shown in equation 2. Accordingly, a photonic processor having N×N modulatable light sources could encode the full input array in parallel.

$$x = \begin{bmatrix} x_{11} & x_{12} & x_{13} & \ldots & x_{1N} \\ x_{21} & x_{22} & x_{23} & \ldots & x_{2N} \\ x_{31} & x_{32} & x_{33} & \ldots & x_{3N} \\ \vdots & \vdots & \vdots & \ddots & \vdots \\ x_{N1} & x_{N2} & x_{N3} & \ldots & x_{NN} \end{bmatrix} \qquad \text{Equation 2}$$

As yet another example, the n numeric values may be a three-dimensional or higher dimensioned input array x, as aspects of the technology described herein are not limited to in this regard.

The parallel processing capabilities also depend on the number of modulatable detectors. In some embodiments, the size of the weighting matrix, M, which can be processed in parallel is determined by the number of modulatable detectors. As shown in FIG. 8B, modulatable detectors 866, 868, 870, 872, and 874 correspond to the first, second, third, fourth, and $j^{th}$ weight parameters of weighting matrix M. Weighting matrix M can be of any suitable size and dimensionality for performing mathematical operations with input vector x. For matrix multiplication, there is a correspondence between the number of columns in the input matrix and the number of rows in the weighting matrix. For example, to multiply a 1×3 input matrix with a 3×1 weighting matrix using an optical processor, such that all the elements are multiplied in parallel, would include three modulatable light sources and three modulatable detectors. As another example, to multiply a 1×3 input matrix with a 3×2 weighting matrix using an optical processor, such that all the elements are multiplied in parallel, the optical processor would include three modulatable light sources and 6 modulatable detectors. Accordingly, in some embodiments configured for parallel processing the number of detectors used for parallel processing will scale as an integer multiple of the number of elements in the input vector. For example, to multiply a 3×3 input matrix with a 3×3 weighting matrix using an optical processor, such that all the elements are multiplied in parallel, the optical processor would include 9 modulatable light sources and 27 modulatable detectors.

As described above, block multiplication can be used to break up a large matrix calculation into smaller submatrix calculations for sequentially computing the calculation result for the large matrix. Block computing can provide for the computational ability to process larger matrixes while reducing the number of optical components used to execute the calculation and, by extension, reducing on-chip spatial requirements. Time domain, frequency domain, and/or spectral multiplexing can be used to increase the computational capacity for a photonic core without increasing the on-chip spatial requirements.

Figure 8C:
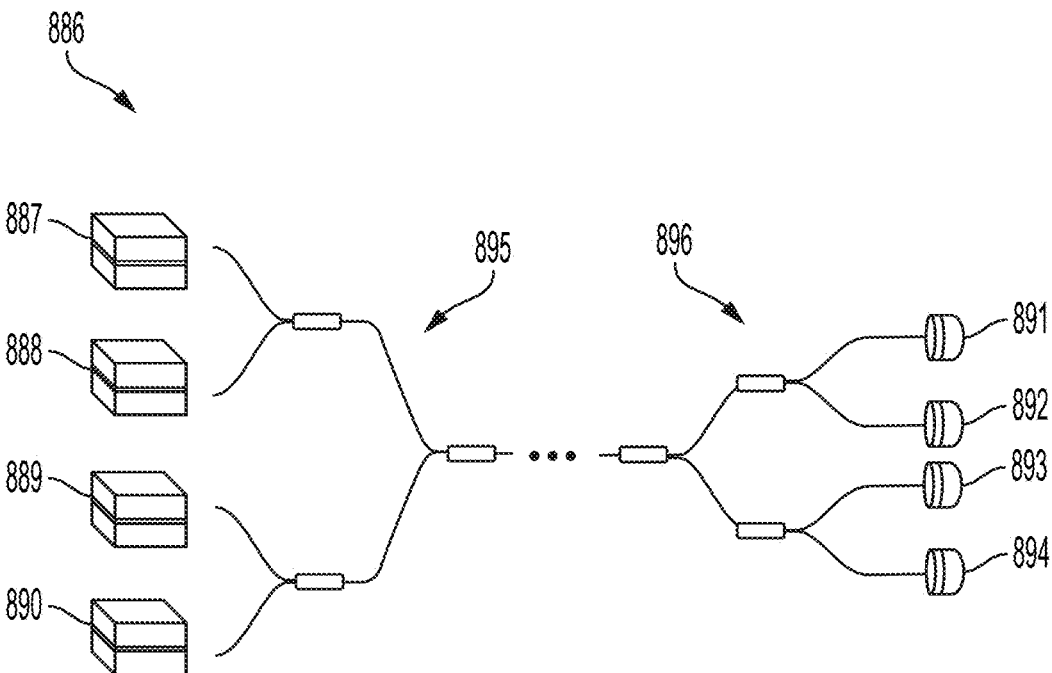
FIG. 8C illustrates a photonic processor configured to multiplex multiple light sources, in accordance with some embodiments.

FIG. 8C illustrates a photonic processor 886 configured to multiplex multiple light sources, in accordance with some embodiments. Photonic processor 886 includes modulatable light sources 887, 888, 889, and 890; modulatable detectors 891, 892, 893, and 894; optical multiplexor 895; and optical tree 896. Optical multiplexor 895 combines the light produced by the modulatable light sources 887, 888, 889, and 890 to have a common optical output. Optical tree 896 distributes light from the common optical output of the optical multiplexor 895 to the modulatable detectors 891, 892, 893, and 894. Accordingly, the same set of modulatable detectors, e.g., 891, 892, 893, and 894, may be used to multiply weighting values with the respective input values from each of the modulatable detectors. For parallel computing, the photonic processor would include four modulatable detectors for each of the modulatable detectors.

For differentiating between the light received by the modulatable detectors, to determine which matrix element the resulting current corresponds to, the photonic processor may utilize frequency division multiplexing or time division multiplexing. For example, in time divisional multiplexing the modulatable light sources 887, 888, 889, and 890 would be configured to generate light at different time such that the resulting current could be selected by the time of its generation. As another example, in frequency division multiplexing, the modulatable detectors would be modulated at different frequencies such that the resulting photocurrents could be selected through frequency filtering techniques and hardware.

Figure 9:
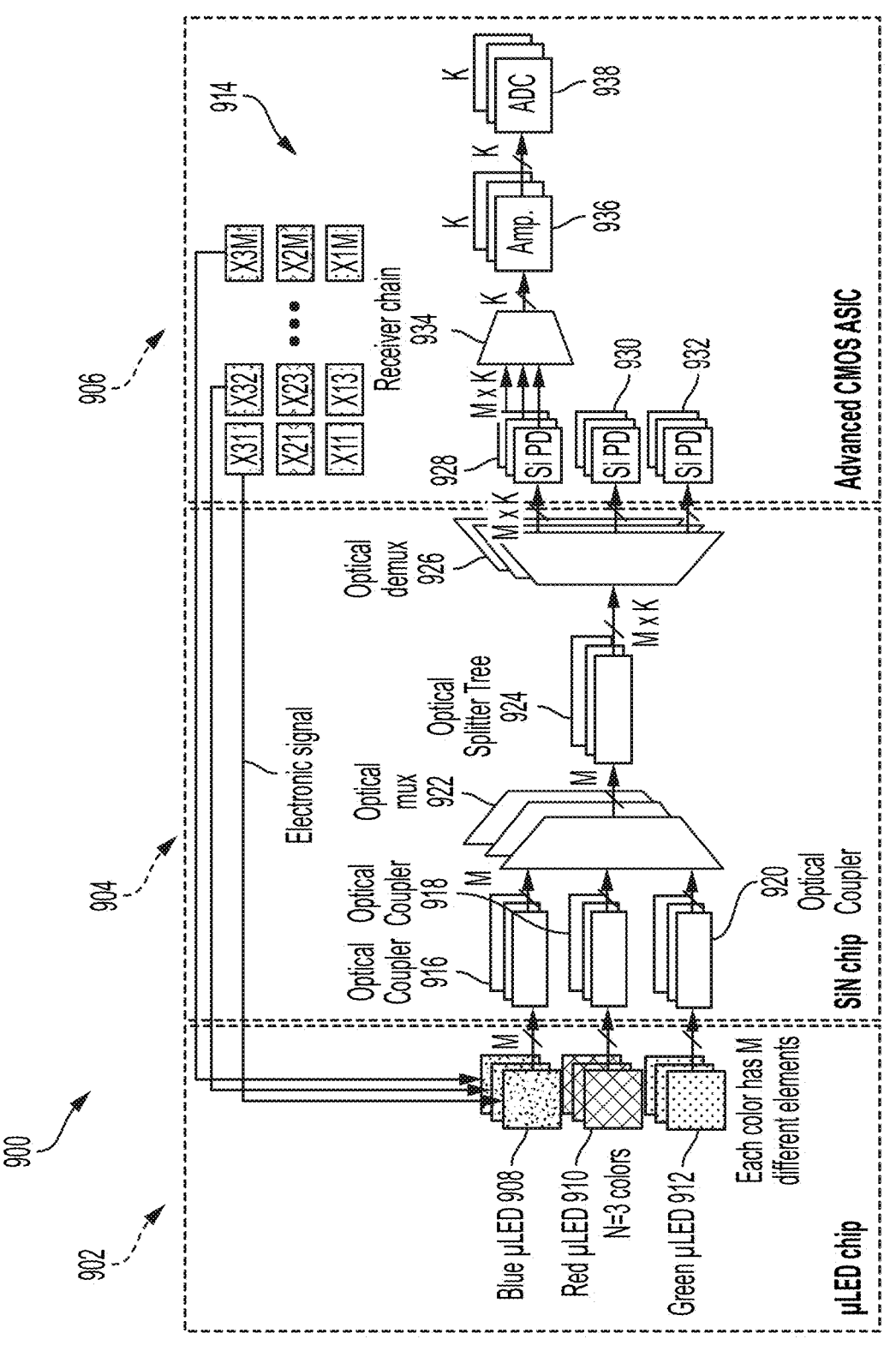
FIG. 9 illustrates a photonic processor configured to operate with spectral multiplexing, in accordance with some embodiments.

FIG. 9 illustrates a photonic processor 900 configured to operate with spectral multiplexing, in accordance with some embodiments. Photonic processor 900 includes an optical source die 902, optical distribution die 904, and optical detection die 906.

Optical source die 902 includes modulatable LEDs having different colors. In some embodiments, optical source die 902 includes modulatable LEDs having two different colors, N=2. In some embodiments, optical source die 902 includes modulatable LEDs having three different colors, N=3. In some embodiments, optical source die 902 includes modulatable LEDs having more than three different colors, N>3. In the illustrated example of FIG. 9, the modulatable LEDs include an array 908 of blue LEDs, an array 910 of red LEDs, and an array 912 of green LEDs. In some embodiments, each array includes M modulatable LEDs. The arrays of modulatable LEDs may receive electronic signals 914 corresponding to elements of an input array X from a processor configured on the optical detection die, as described herein.

In some embodiments, the arrays of LEDs are arrays of micro-LEDs. Optical distribution die 904 includes optical couplers 916, 918, and 920 for coupling light emitted from the arrays of LEDs into the optical distribution network. In some embodiments, the optical couplers 916, 918, and 920 are optical gratings coupled to waveguides such that when light from the LEDs is received by the optical coupler, the radiative energy is coupled into a propagating optical mode of the waveguide. In some embodiments, tapered waveguides may be used for coupling light into waveguides on the optical distribution die 904. In some embodiments, a combination of tapered waveguides and optical gratings may be used for coupling light into waveguides on the optical distribution die 904.

As shown in FIG. 9, the number of optical couplers corresponds to the number of LEDs. Accordingly, each of optical couplers 916, 918, and 920 may be configured as arrays of optical couplers having a number of optical coupling elements that corresponds with the number of modulatable light sources of the photonic processor. For example, optical couplers 916 include M optical coupling elements for receiving M optical signals from array 908 of blue LEDs, respectively. Optical couplers 918 include M optical coupling elements for receiving M optical signals from array 910 of red LEDs, respectively. Optical couplers 920 include M optical coupling elements for receiving M optical signals from array 912 of green LEDs, respectively. Accordingly, each optical coupler may correspond to a separate monochromatic color channel, with the photonic processor having N×M monochromatic channels.

In some embodiments, a monochromatic channel includes the signals generated by a single LED. In some embodiments, multiple LEDs configured to operate at the same or approximately the same center wavelength may be configured to operate with time-divisional and/or frequency divisional multiplexing and may be included in a single monochromatic channel.

The arrays of optical couplers 916, 918, and 920 are optically coupled to optical multiplexer 922. Optical multiplexer 922 may be configured to reduce the total number of waveguides and optical splitters used in the branched optical distribution circuit 924 by combining multiple optical signals into a single waveguide. For example, the optical multiplexor may combine signals received from a single output of each color channel into a single multicolor channel. For example, optical multiplexor 922 may combine the output of a single optical coupler from optical coupler array

916, with a single output of a single optical coupler from optical coupler array 918, and with a single output of a single optical coupler from optical coupler array 920. Thereby, the optical multiplexor 922 may include three optical signals with different center wavelengths in the same waveguide. Similarly, optical multiplexor 922 may combine signals from the three optical coupler arrays for each of the M optical couplers in each array. Accordingly, optical multiplexor 922 may reduce N×M monochromatic channels to M multicolor channels. Optical multiplexor 922 may be configured as an array of M individual multiplexors, as shown in FIG. 9.

Optical distribution circuit 924 may be configured as an array of optical splitters, such as an optical splitter tree. Optical distribution circuit 924 may be configured to split each the M multicolor channels into K channels. Accordingly, optical distribution circuit 924 may expand the number of channels from M multicolor channels to M×K multicolor channels, e.g., M×K waveguides. In some embodiments, the optical components of optical distribution circuit 924 may be formed of silicon nitride to support the routing of visible light.

The output of optical distribution circuit 924 may be demultiplexed by optical demultiplexer 926 to separate out the spectral components of the multicolor channels. In some embodiments, optical demultiplexer may also function as an optical coupler to couple light out of the optical distribution chip 904 to optical detection chip 906. For example, optical gratings may be configured to couple specific wavelengths out of a waveguide while leaving the other wavelengths propagating through the waveguide. Accordingly, the waveguide for each channel may include N different optical gratings for coupling each of the N different color components out of the waveguide at a different spatial location. In some embodiments, the optical demultiplexing may be configured separately from the optical couplers. For example, resonant coupling between the multicolor channel and a monochromatic channel may be used to couple out the resonant wavelength from the waveguide with multiple propagating colors and into a monochromatic waveguide which may subsequently be coupled out of the optical distribution die using an optical coupler. Examples of resonant couplers may include ring resonators, and critical coupling between adjacent waveguides.

Optical demultiplexing will expand the number of channels from M×K multicolor channels to M×K×N monochromatic channels. As shown in FIG. 9, the demultiplexed monochromatic channels are coupled out of the optical distribution chip 904 to the optical detection chip 906. Optical detection chip 906 includes a modulatable detector for each output channel of the optical distribution chip 904. For example, optical detection chip 906 includes M×K×N modulatable detectors. In some embodiments, the modulatable detectors may be configured as an array of detectors. In some embodiments, the modulatable detectors may be configured in detection sub-arrays of detectors. In the illustrated example of FIG. 9, N sub-arrays of detectors 928, 930, and 932 are configured to receive respective outputs from the optical distribution chip 904. In some embodiments, the subarrays may be grouped by color such that sub-array 928 corresponds to detectors of blue light, sub-array 930 corresponds to detectors of red light, and sub-array 932 corresponds to detectors of green light. In some embodiments, the sub-arrays may be grouped to reduce the distance electrical signals travel in the receiver chain 934. Reducing the distance electrical signals travel in the receiver chain may reduce the capacitance of the system and increase the bandwidth.

In some embodiments, the sub-arrays of detectors 928, 930, and 932 are silicon photodiodes configured to support the detection of visible light. Accordingly, the combination of the silicon nitride photonic components on the optical distribution chip and the silicon photo detectors in the optical detection chip, provide for processing of the visible light generated by the LEDs.

The modulatable detectors are configured to perform a mathematical operation based on the input value encoded in the light which is received by the photodetector and a weighting value, as described herein. In some embodiments, the modulatable detectors are silicon photodetectors. In other embodiments, the modulatable detectors may be any other suitable photodetector, as described herein.

Receiver chain 934 receives the photocurrents generated by the photodetectors and may be configured to combine analog signals in accordance with a matrix multiplication operation. For example, if each array of LEDs of a specific color are configured to encode values corresponding to a particular column of an input array and the corresponding M×K photodetectors correspond to a particular element of a weighting array, the receiving chain may sum the appropriate photocurrents to generate a current indicative of output matrix component Y. For example, the M×K sub-array of photodetectors may sum the M elements to produce a Y output element. Accordingly, receiver chain 934 may have K output components and the output vector Y may have K elements.

In some embodiments, all three sub-arrays of photodetectors may be summed when the N×M components correspond to a single column of an input vector, in which case the receiver chain will have K outputs. In other embodiments, each color may correspond to a separate column of an input matrix, in which case the receiver chain will have N×K outputs.

In some embodiments, the photonic processor may be configured to perform block matrix multiplication and the receiver chain may be configured to sum the appropriate photocurrents in sub-arrays. In some embodiments, the photonic processor may be configured to perform different mathematical operations and the receiver chain may be configured to combine the resulting photocurrents accordingly.

Following receiver chain 934, amplifiers 936 may be configured to amplify the corresponding signals of the output components. In some embodiments, the number of amplifiers will correspond to the number of outputs of the receiver chain 934. For example, the amplifiers 936 may include K separate amplifiers configured to separately amplify each of the K elements of output vector Y.

An array of ADCs 938 may be configured to convert the analog elements of output vector Y into a digital signal representing the result of the mathematical operation. In some embodiments, the number of ADCs will correspond to the number of amplifiers 936. For example, photonic processor 900 may include K ADCs configured to covert K elements of output vector Y into a digital signal.

For some applications, similar architectures as those described above may be used to distribute a data/signal to one or more locations within the optical detection die. In some embodiments, the feature size of electronic circuitry, e.g., electronic traces, may be smaller than the feature size of optical distribution elements, e.g., waveguides. However, as the feature size of electronic circuitry gets smaller and the distance to travel gets longer the capacitance of the electronic circuitry may impact the bandwidth of data/signal transmission across the photonic processor. By contrast, optical distribution elements may transport data/signals with negligible to no losses which may provide for increased bandwidths with high power efficiency, relative to electronic circuitry. Accordingly, in some embodiments, LEDs may be used to encode data/signals for distribution across a photonic die.

Referring again to the architecture of FIG. 8A, in some embodiments configured to distribute data/signals through optical distribution elements, the output photocurrents of detectors 810, 812, 814, and 816 may not be summed up using electrical wires. Instead, the output photocurrent of each detector may be fed to a respective transimpedance amplifier (TIA) and a respective receiver circuit that converts the photocurrent to bits. In this case, the circuit may be configured to distribute a number, which is encoded in the light emission of the LED by modulation of the LED 802, to multiple locations within the chip. Furthermore, detectors 818, 820, 822, 824, 826, 828, 830, 832, 834, 836, 838, and 840 may also have their output photocurrents converted directly to digital bits (without any summation). The LEDs 804, 806, and 808 are then also configured to distribute/broadcast their data to multiple locations within the chip. The numbers that are broadcasted can then be stored in a memory unit or then processed digitally by a digital compute block. If the LEDs are broadcasting a series of bits that constitute a header and data, then the numbers can be further processed by a digital switching block that routes the data according to the header.

For data distribution, the LEDs may be switched or modulated using amplitude-modulation such as NRZ/OOK/PAM-2, PAM-4, or PAM-N. The signal received at the photodetector may only be 1 or few bits of precision, and an ADC may not be necessary. Equalization analog blocks can be attached on the LED modulator side (TX) as well as the detector side (RX). The equalization blocks are used to compensate for channel non-idealities. Accordingly, in some embodiments, the detectors used for data distribution may not be modulatable. In some embodiments, the detectors used for data distribution may be modulatable but may not be modulated during the data distribution process, e.g., may have a constant characteristic to facilitate detection of optical signals. In some embodiments, the detectors used for data distribution may be modulated to perform mathematical operations or transformations on the data/signals being distributed.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A photonic device configured to perform a mathematical operation, the photonic device comprising:
   - a first die comprising a plurality of modulatable LEDs, including a first modulatable LED, configured to emit visible light;
   - a second die comprising a plurality of modulatable detectors optically coupled to an output of the LED;
   - a third die comprising a photonic tree circuit optically coupling the modulatable LED to the plurality of modulatable detectors, the photonic tree circuit comprising silicon nitride optical components;
   - a controller electrically coupled to both the modulatable LED and the plurality of modulatable detectors, the controller being configured to encode a value in light emitted by the first modulatable LED and a vector in respective characteristics of the plurality of modulatable detectors, wherein the value is an input value of an input matrix and the vector is a weighting vector of a weighting matrix; and
   - a receiver configured to determine a result of the mathematical operation based on an electrical signal produced by the plurality of modulatable detectors.

2. The photonic device of claim 1, wherein:
   the first die is disposed on top of the third die and the third die is disposed on top of the second die, and wherein the first die is electrically coupled to the second die through a plurality of vias in the third die.

3. The photonic device of claim 1, wherein the first modulatable LED comprises a resonant cavity configured to produce single mode light emission.

4. The photonic device of claim 1, wherein the plurality of modulatable LEDs comprise a plurality of blue LEDs, a plurality of red LEDs, and a plurality of green LEDs.

5. The photonic device of claim 1, wherein the controller is configured to encode the first value in an intensity of light emitted by the first modulatable LED.

6. The photonic device of claim 1, wherein the plurality of modulatable detectors detector are silicon photodetectors.

7. A photonic device configured to perform a mathematical operation, comprising:

a modulatable light emitting diode (LED) configured to emit light;

a modulatable detector optically coupled to an output of the modulatable LED;

a controller electrically coupled to both the modulatable LED and the modulatable detector, the controller being configured to encode a first value in the light emitted by the modulatable LED and to encode a second value in a characteristic of the modulatable detector;

a receiver configured to determine a result of the mathematical operation based on an electrical signal produced by the modulatable detector; and a photonic circuit optically coupling the modulatable LED to the modulatable detector, wherein the photonic circuit comprises silicon nitride waveguides and an input grating configured to couple visible light emitted by the modulatable LED into the silicon nitride waveguides.

8. The photonic device of claim 7, wherein the modulatable LED comprises a resonant cavity configured to produce single mode light emission.

9. The photonic device of claim 7, wherein:

the modulatable LED is formed on a first die;

the photonic circuit is formed on a second die;

the modulatable detector and the controller are formed on a third die; and the first die is disposed on top of the second die and the second die is disposed on top of the third die, and wherein the first die is electrically coupled to the third die through a plurality of vias in the second die.

10. The photonic device of claim 7, wherein the modulatable LED is a first modulatable LED of a plurality of modulatable LEDs, the first value is a value of an input matrix, the modulatable detector is a first modulatable detector of a plurality of modulatable detectors, and the second value is a weighting value of a weighting matrix.

11. The photonic device of claim 10, wherein the plurality of modulatable LEDs comprise a plurality of blue LEDs, a plurality of red LEDs, and a plurality of green LEDs.

12. The photonic device of claim 11, wherein the controller is configured to encode the first value in an intensity of light emitted by the modulatable LED.

13. The photonic device of claim 11, wherein the modulatable detector is a silicon photodetector.

14. The photonic device of claim 13, wherein the controller is configured to encode the second value in a gain of the silicon photodetector.

15. A method for performing a mathematical operation, the method comprising:

generating an encoded optical signal indicative of a first value using a modulatable light emitting diode (LED) configured to emit visible light, wherein the first value is a value of an input matrix;

setting a characteristic of a modulatable photodetector, optically coupled to the LED, to be indicative of a second value, wherein the second value is a weighting value of a weighting matrix;

generating, using the modulatable photodetector, a photocurrent indicative of both the first value and the second value; and determining a result of the mathematical operation based on the photocurrent.

16. The method of claim 15, wherein generating the encoded optical signal comprises encoding the first value in an intensity of light emitted by the modulatable LED.

17. The method of claim 15, wherein generating the encoded optical signal comprises encoding the first value in light emitted by the modulatable LED using gain switching of modulatable LED.

18. The method of claim 15, wherein generating the encoded optical signal comprises encoding the first value in an amplitude of light emitted by the modulatable LED.

19. The method of claim 15, wherein generating the encoded optical signal comprises encoding the first value in a pulse duration of light emitted by the modulatable LED.

20. The method of claim 15, wherein configuring the characteristic of the modulatable photodetector comprises setting a responsivity of the photodetector based on the second value.

21. The method of claim 15, wherein configuring the characteristic of the modulatable photodetector comprises setting a current gain based on the second value.

22. The photonic device of claim 1, wherein the photonic tree circuit further comprises silicon nitride waveguides and an input grating configured to couple visible light emitted by the first modulatable LED into the silicon nitride waveguides.

* * * * *